US010714601B2

(12) United States Patent
Colinge (10) Patent No.: US 10,714,601 B2
(45) Date of Patent: Jul. 14, 2020

(54) FABRICATION OF A TRANSISTOR WITH A CHANNEL STRUCTURE AND SEMIMETAL SOURCE AND DRAIN REGIONS

(71) Applicant: COMMISSARIAT A L'ENERGIE ATOMIQUE ET AUX ENERGIES ALTERNATIVES, Paris (FR)

(72) Inventor: Jean-Pierre Colinge, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/054,197

(22) Filed: Aug. 3, 2018

(65) Prior Publication Data
US 2019/0043970 A1    Feb. 7, 2019

(30) Foreign Application Priority Data

Aug. 7, 2017    (FR) ..................... 17 57568

(51) Int. Cl.
*H01L 29/737*    (2006.01)
*H01L 29/06*    (2006.01)
(Continued)

(52) U.S. Cl.
CPC .......... *H01L 29/7371* (2013.01); *B82Y 10/00* (2013.01); *B82Y 40/00* (2013.01); *C30B 23/02* (2013.01); *C30B 29/40* (2013.01); *H01L 21/02636* (2013.01); *H01L 21/441* (2013.01); *H01L 21/76224* (2013.01); *H01L 29/0676* (2013.01); *H01L 29/0847* (2013.01); *H01L 29/12* (2013.01); *H01L 29/24* (2013.01);
(Continued)

(58) Field of Classification Search
CPC .......... H01L 29/7827; H01L 29/42392; H01L 29/78696; H01L 29/0676; H01L 29/66666; H01L 29/78642
USPC .......... 438/268, 382; 257/E29.245, E29.255
See application file for complete search history.

(56) References Cited

U.S. PATENT DOCUMENTS 4,725,561 A    2/1988 Haond et al.
4,810,664 A    3/1989 Kamins et al.
(Continued)

FOREIGN PATENT DOCUMENTS

EP          1 804 286        7/2007
WO    WO 2016/048306 A1     3/2016
(Continued)

OTHER PUBLICATIONS

French Preliminary Search Report dated Apr. 18, 2018 in French Application 17 57568, filed on Aug. 7, 2017 (with English Translation of Categories of Cited Documents).
(Continued)

*Primary Examiner* — Jonathan Han
(74) *Attorney, Agent, or Firm* — Oblon, McClelland, Maier & Neustadt, L.L.P.

(57) ABSTRACT

A vertical channel transistor comprising:
a structure made of a given bismuth-based material which passes through a gate block where the structure comprises a channel region which extends through the gate block and source and drain regions on either side of the channel region and of the gate block, where the source and drain regions have a cross-section which is greater than the cross-section of the channel region (FIG. 1K).

15 Claims, 9 Drawing Sheets

(51) Int. Cl.
  *H01L 29/12* (2006.01)
  *H01L 29/423* (2006.01)
  *H01L 29/08* (2006.01)
  *H01L 21/02* (2006.01)
  *H01L 21/441* (2006.01)
  *H01L 21/762* (2006.01)
  *H01L 29/78* (2006.01)
  *H01L 29/24* (2006.01)
  *H01L 29/775* (2006.01)
  *C30B 29/40* (2006.01)
  *C30B 23/02* (2006.01)
  *B82Y 40/00* (2011.01)
  *B82Y 10/00* (2011.01)
  *H01L 29/66* (2006.01)

(52) U.S. Cl.
  CPC ...... *H01L 29/42392* (2013.01); *H01L 29/775* (2013.01); *H01L 29/7827* (2013.01); *H01L 29/66439* (2013.01)

(56) References Cited

U.S. PATENT DOCUMENTS

| | | | |
|---|---|---|---|
| 4,857,476 A | 8/1989 | Colinge | |
| 6,359,311 B1 | 3/2002 | Colinge et al. | |
| 6,391,752 B1 | 5/2002 | Colinge et al. | |
| 7,253,043 B2 | 8/2007 | Colinge et al. | |
| 8,178,862 B2 | 5/2012 | Colinge | |
| 8,772,109 B2 | 7/2014 | Colinge | |
| 8,815,691 B2 | 8/2014 | Colinge et al. | |
| 8,823,060 B1 | 9/2014 | Colinge et al. | |
| 8,963,206 B2 | 2/2015 | Colinge | |
| 8,999,805 B1 | 4/2015 | Colinge et al. | |
| 9,006,786 B2 | 4/2015 | Ching et al. | |
| 9,006,829 B2 | 4/2015 | Colinge et al. | |
| 9,006,842 B2 | 4/2015 | Colinge et al. | |
| 9,034,717 B2 | 5/2015 | Colinge | |
| 9,048,301 B2 | 6/2015 | Wang et al. | |
| 9,111,996 B2 | 8/2015 | Colinge | |
| 9,147,753 B2 | 9/2015 | Colinge et al. | |
| 9,177,924 B2 | 11/2015 | Colinge et al. | |
| 9,184,269 B2 | 11/2015 | Ching et al. | |
| 9,190,473 B2 | 11/2015 | Colinge | |
| 9,196,730 B1 | 11/2015 | Yu et al. | |
| 9,209,022 B2 | 12/2015 | Colinge et al. | |
| 9,209,247 B2 | 12/2015 | Colinge et al. | |
| 9,219,115 B2 | 12/2015 | Colinge | |
| 9,224,849 B2 | 12/2015 | Colinge et al. | |
| 9,263,295 B2 | 2/2016 | Wang et al. | |
| 9,263,535 B2 | 2/2016 | Colinge et al. | |
| 9,275,910 B2 | 3/2016 | Colinge | |
| 9,276,114 B2 | 3/2016 | Colinge et al. | |
| 9,299,810 B2 | 3/2016 | Ching et al. | |
| 9,343,551 B2 | 5/2016 | Ching et al. | |
| 9,349,850 B2 | 5/2016 | Colinge et al. | |
| 9,356,020 B2 | 5/2016 | Colinge et al. | |
| 9,368,619 B2 | 6/2016 | Colinge et al. | |
| 9,412,828 B2 | 8/2016 | Ching et al. | |
| 9,419,003 B1 | 8/2016 | Colinge et al. | |
| 9,419,098 B2 | 8/2016 | Colinge et al. | |
| 9,425,324 B2 | 8/2016 | Diaz et al. | |
| 9,466,668 B2 | 10/2016 | Colinge et al. | |
| 9,478,624 B2 * | 10/2016 | Colinge | H01L 29/42376 |
| 9,484,460 B2 | 11/2016 | Colinge et al. | |
| 9,490,348 B2 | 11/2016 | Ching et al. | |
| 9,508,858 B2 | 11/2016 | Diaz et al. | |
| 9,564,431 B2 | 2/2017 | Colinge et al. | |
| 9,564,493 B2 | 2/2017 | Colinge et al. | |
| 9,570,579 B2 | 2/2017 | Colinge et al. | |
| 9,614,059 B2 | 4/2017 | Colinge | |
| 9,614,091 B2 | 4/2017 | Colinge et al. | |
| 9,620,422 B2 | 4/2017 | Colinge et al. | |
| 9,620,591 B2 | 4/2017 | Yu et al. | |
| 9,634,091 B2 | 4/2017 | Ching et al. | |
| 9,634,132 B2 | 4/2017 | Yu et al. | |
| 9,640,645 B2 | 5/2017 | Colinge et al. | |
| 9,653,457 B2 | 5/2017 | Guo et al. | |
| 9,653,604 B1 | 5/2017 | Colinge et al. | |
| 9,659,632 B2 | 5/2017 | Guo et al. | |
| 9,660,107 B1 | 5/2017 | Colinge et al. | |
| 9,673,209 B2 | 6/2017 | Colinge et al. | |
| 2005/0067629 A1 | 3/2005 | Woodall et al. | |
| 2006/0281268 A1 | 12/2006 | Colinge et al. | |
| 2010/0276662 A1 | 11/2010 | Colinge | |
| 2011/0012085 A1 | 1/2011 | Deligianni et al. | |
| 2012/0305893 A1 | 12/2012 | Colinge | |
| 2014/0054650 A1 | 2/2014 | Colinge | |
| 2014/0054724 A1 | 2/2014 | Ching et al. | |
| 2014/0110755 A1 | 4/2014 | Colinge | |
| 2014/0138780 A1 | 5/2014 | Colinge et al. | |
| 2014/0183643 A1 | 7/2014 | Colinge et al. | |
| 2014/0225184 A1 | 8/2014 | Colinge et al. | |
| 2014/0231872 A1 | 8/2014 | Colinge et al. | |
| 2014/0268444 A1 * | 9/2014 | Bertin | H01L 27/0266 361/56 |
| 2014/0312388 A1 | 10/2014 | Colinge | |
| 2014/0332859 A1 | 11/2014 | Colinge et al. | |
| 2014/0353731 A1 | 12/2014 | Colinge et al. | |
| 2015/0008483 A1 | 1/2015 | Ching et al. | |
| 2015/0008489 A1 | 1/2015 | Ching et al. | |
| 2015/0021697 A1 | 1/2015 | Colinge et al. | |
| 2015/0048441 A1 | 2/2015 | Colinge et al. | |
| 2015/0048442 A1 | 2/2015 | Colinge et al. | |
| 2015/0048453 A1 | 2/2015 | Ching et al. | |
| 2015/0048454 A1 | 2/2015 | Colinge et al. | |
| 2015/0053928 A1 | 2/2015 | Ching et al. | |
| 2015/0060996 A1 | 3/2015 | Colinge et al. | |
| 2015/0069475 A1 | 3/2015 | Colinge et al. | |
| 2015/0069501 A1 | 3/2015 | Colinge et al. | |
| 2015/0076596 A1 | 3/2015 | Colinge et al. | |
| 2015/0097227 A1 | 4/2015 | Colinge et al. | |
| 2015/0102287 A1 | 4/2015 | Wang et al. | |
| 2015/0102424 A1 | 4/2015 | Colinge | |
| 2015/0102466 A1 | 4/2015 | Colinge | |
| 2015/0102469 A1 | 4/2015 | Colinge et al. | |
| 2015/0102471 A1 | 4/2015 | Colinge | |
| 2015/0129831 A1 | 5/2015 | Colinge et al. | |
| 2015/0137067 A1 | 5/2015 | Colinge et al. | |
| 2015/0171032 A1 | 6/2015 | Colinge et al. | |
| 2015/0194503 A1 | 7/2015 | Ching et al. | |
| 2015/0200252 A1 | 7/2015 | Ching et al. | |
| 2015/0214318 A1 | 7/2015 | Ching et al. | |
| 2015/0214333 A1 | 7/2015 | Colinge et al. | |
| 2015/0228775 A1 | 8/2015 | Yu et al. | |
| 2015/0236086 A1 | 8/2015 | Colinge et al. | |
| 2015/0236092 A1 | 8/2015 | Yu et al. | |
| 2015/0236145 A1 | 8/2015 | Yu et al. | |
| 2015/0255306 A1 | 9/2015 | Wang et al. | |
| 2015/0262888 A1 | 9/2015 | Colinge | |
| 2015/0333078 A1 | 11/2015 | Colinge et al. | |
| 2015/0372149 A1 | 12/2015 | Colinge et al. | |
| 2015/0380520 A1 | 12/2015 | Colinge et al. | |
| 2015/0380539 A1 | 12/2015 | Colinge et al. | |
| 2016/0049391 A1 | 2/2016 | Colinge et al. | |
| 2016/0049472 A1 | 2/2016 | Yu et al. | |
| 2016/0056236 A1 | 2/2016 | Ching et al. | |
| 2016/0064221 A1 | 3/2016 | Colinge et al. | |
| 2016/0071970 A1 | 3/2016 | Hatcher et al. | |
| 2016/0071977 A1 | 3/2016 | Colinge | |
| 2016/0087054 A1 | 3/2016 | Colinge et al. | |
| 2016/0093745 A1 * | 3/2016 | Diaz | H01L 29/78696 257/29 |
| 2016/0111526 A1 | 4/2016 | Colinge | |
| 2016/0141361 A1 | 5/2016 | Wang et al. | |
| 2016/0141423 A1 | 5/2016 | Diaz et al. | |
| 2016/0181429 A1 | 6/2016 | Colinge et al. | |
| 2016/0211259 A1 | 7/2016 | Guo et al. | |
| 2016/0218216 A1 | 7/2016 | Diaz et al. | |
| 2016/0268168 A1 | 9/2016 | Colinge et al. | |
| 2016/0268382 A1 * | 9/2016 | Colinge | H01L 29/267 |
| 2016/0268427 A1 | 9/2016 | Colinge et al. | |
| 2016/0336329 A1 | 11/2016 | Colinge et al. | |
| 2016/0336445 A1 | 11/2016 | Colinge et al. | |

(56) References Cited

U.S. PATENT DOCUMENTS

| | | | |
|---|---|---|---|
| 2016/0343857 | A1 | 11/2016 | Colinge et al. |
| 2017/0025537 | A1 | 1/2017 | Ching et al. |
| 2017/0047429 | A1 | 2/2017 | Colinge et al. |
| 2017/0053983 | A1* | 2/2017 | Holland ............ H01L 21/02433 |
| 2017/0062319 | A1 | 3/2017 | Guo et al. |
| 2017/0077253 | A1 | 3/2017 | Diaz et al. |
| 2017/0084461 | A1 | 3/2017 | Colinge et al. |
| 2017/0110180 | A1 | 4/2017 | Guo et al. |
| 2017/0117377 | A1 | 4/2017 | Colinge et al. |
| 2017/0117405 | A1 | 4/2017 | Colinge |
| 2017/0125554 | A1 | 5/2017 | Colinge et al. |

FOREIGN PATENT DOCUMENTS

| | | |
|---|---|---|
| WO | WO 2016/048377 A1 | 3/2016 |
| WO | WO 2017/046024 A1 | 3/2017 |

OTHER PUBLICATIONS

Lida Ansari, et al., "A Proposed Confinement Modulated Gap Nanowire Transistor Based on a Metal (Tin)", Nano Letters, American Chemical Society, vol. 12, No. 5, Apr. 27, 2012, pp. 2222-2227.

Ya-Chi Cheng, et al., "A Highly Scalable Poly-Si Junctionless FETs Featuring a Novel Multi-Stacking Hybrid P/N Layer and Vertical Gate with Very High Ion/Ioff for 3D Stacked ICs", 2016 IEEE Symposium on VLSI Technology Digest of Technical Papers, 2 pgs.

Liang Li, et al., "A route to fabricate single crystalline bismuth nanowire arrays with different diameters", Chemical Physics Letters 378, 2003, pp. 244-249.

Steven J. Limmer, et al., "Recrystallized Arrays of Bismuth Nanowires with Trigonal Orientation", Nano Letters, Feb. 2014, 6 pgs.

Wooyoung Shim, et al., "On-Film Formation of Bi Nanowires with Extraordinary Electron Mobility", Nano Letters, vol. 9, No. 1, 2009, 5 pgs.

Seunghyun Lee, et al., "Direct observation of the semimetal-to-semiconductor transition of individual single-crystal bismuth nanowires grown by on-film formation of nanowires", Nanotechnology 21, 2010, 7 pgs.

Zhibo Zhang, et al., "Electronic transport properties of single-crystal bismuth nanowire arrays", Physical Review B, vol. 61, No. 7, Feb. 15, 2000-I, 12 pgs.

Yu-Ming Lin, et al., "Semimetal-semiconductor transition in $Bi_{1-x}Sb_x$ alloy nano wires and their thermoelectric properties", Appl. Phys. Lett. 81,2403(2002); doi: 10.1063/1.1503873, 4pgs.

Yu-Ming Lin, et al., "Transport properties of $Bi_{1-x}Sb_x$ alloy nanowires synthesized by pressure injection",Appl. Phys. Lett. 79,677(2001); doi: 10.1063/1.1385800, 4pgs.

* cited by examiner

FABRICATION OF A TRANSISTOR WITH A CHANNEL STRUCTURE AND SEMIMETAL SOURCE AND DRAIN REGIONS

TECHNICAL FIELD AND PRIOR ART

The present application relates to the field of microelectronics and of semiconductors, in particular that of transistors formed from a semimetal base, such as bismuth.

Document US2017/0125554 A1 describes, for example, a transistor which has a channel structure made of bismuth and whose arrangement is vertical, that is, in a direction which is substantially parallel to a normal to a principal plane of the support on which the transistor is formed.

The problem of improving such a transistor structure arises, in particular at the contact resistances with the source and drain regions.

DESCRIPTION OF THE INVENTION

The present invention relates to the fabrication of a transistor device with a vertically arranged channel and which is based on a semimetal such as bismuth, wherein the source and drain regions contact resistances are in particular reduced.

In order to do this, one embodiment of the present invention envisages a method comprising steps for:
  the formation of a stack equipped with a first source or drain contact zone and of a first layer on this first contact zone,
  the formation on this stack of a gate block and of a second layer on this gate block,
  the formation of at least one hole passing through the second layer, the gate block and the first layer so as to reveal the first contact zone, where the hole is made so as to have a first portion and a second portion located in the first layer and in the second layer respectively, each having a cross-section that is greater than that of a third portion of the hole located in the gate block,
  filling the hole using a given semimetal based material, so as to form a source or drain region in the first portion, a channel region in the third portion, a drain or source region in the second portion, where the channel region has a cross-section which is smaller than that of the source and drain regions.

The given semimetal-based material is advantageously bismuth or a bismuth-based alloy such as a material based on bismuth and tin, or on bismuth and antimony, or bismuth and arsenic, or an alloy of bismuth, tin, antimony and arsenic or an alloy comprising the aforementioned element or elements and bismuth.

Such a material has the advantage of exhibiting the properties of a semiconductor or of a conductive material depending on its dimensions.

Thus a third portion and first and second portions may be envisaged with respective dimensions, in particular cross-sections, adapted so as to form, from a given material, a semi-conductor channel region and conductive source and drain regions.

The channel region is thus advantageously provided with a cross-section of critical dimensions or of diameter less than a threshold value below which the given material is a semi-conductor, with valence and conduction bands separated by a forbidden band, whose gap is positive.

When the given material is, for example, bulk bismuth this threshold may be of the order of 15 nm at ambient temperature.

The source and drain regions are preferably provided with, respectively, cross-sections of the critical dimension or of diameter greater than this threshold.

Advantageously, the first layer and the second layer are made of insulating material.

According to a possible embodiment, after the hole formation and before filling of the hole using the given material, a gate dielectric may be formed in a zone located in the hole and on the gate block by at least one oxidation of the gate block.

Advantageously the first contact zone is based on a material which is insensitive to oxidation of the gate block, in particular a noble metal such as platinum. This may avoid the need to make the gate dielectric on the first contact zone and subsequently having to remove it. This contributes to making a contact of improved contact.

The given bismuth-based material may be polycrystalline at the time it is deposited. Then, after filling, a recrystallisation annealing step is carried out in order to give it a monocrystalline constitution.

Advantageously, the semimetal-based material is non-doped. Thus uncontrolled distribution of dopants during recrystallisation is avoided.

Prior to the recrystallisation annealing, connection pads may advantageously be formed by the creation of openings which respectively reveal the gate block and the first contact zone, then the openings are filled using at least one conductive material.

When the gate block formed is provided with a dopant gradient, a hole with a flared form may be made in the gate block and thus a channel with a flared form may be made. This may enable any potential barrier between the channel and the drain to be reduced and therefore reduces any electron reflection effect towards the channel, which could cause a reduction in the current.

The formation of the first hole portion and of the second hole portion may comprise selective etching of the first layer and the second layer relative to the gate block. Etching using HF may be used in particular when the first layer and the second layer are made of silicon oxide.

According to another aspect, the present invention also envisages a vertical channel transistor obtained using a method as defined above.

In particular, one embodiment envisages a transistor comprising:
  a gate block,
  a structure made of a given bismuth-based material which passes through this gate block,
  where the structure comprises a channel region extends through the gate block and the source and drain regions on either side of the channel region and of the gate block, where the source and drain regions have a cross-section which is greater than the cross-section of the channel region,
  a first contact zone made of conductive material and positioned against the bismuth-based source region,
  a second contact zone made of conductive material and positioned against the bismuth-based drain region.

Advantageously, one embodiment envisages a channel region with portions of flared form arranged head to tail.

Another embodiment envisages a channel region comprising a portion which has a flared form between a first face and a second face of the gate block.

One embodiment envisages a channel region formed from a plurality of bismuth-based nanowires.

Another aim of present application is also to protect a device comprising at least one first transistor and at least one second transistor made of semimetals as defined above or obtained using a method as defined above, where the transistors are stacked.

According to one possible embodiment, the first transistor and the second transistor share a common electrode.

According to another possible embodiment, the first transistor is positioned between the conductive lines of a first pair of conductive lines, the second transistor being positioned between the conductive lines of second pair of conductive lines.

BRIEF DESCRIPTION OF THE DRAWINGS

The present invention will be better understood on reading the description of embodiment examples, which are given for purely informative purposes and which are in no way restrictive, whilst referring to the appended diagrams in which:

The FIGS. 1A-1K show an example of a method of fabrication of a transistor structure comprising source, drain and channel regions made of a semimetallic material, in particular bismuth-based;

FIGS. 2A-2D illustrate various examples of transistor structures made of semimetallic materials and comprising source and drain regions with a larger cross-section than that of the channel region;

FIGS. 3A-3C illustrate various examples of devices with transistor structures made of stacked semimetallic materials;

FIGS. 4A-4B illustrate examples of transistor channel structures formed from one or more nanowires made of bismuth passing through a gate block;

Identical, similar or equivalent portions of the various figures have the same numerical references, to make it easier to pass from one figure to another.

In order to make the figures more readable, the various parts shown in the figures are not necessarily shown at a uniform scale.

Furthermore, in the description hereafter, terms which depend on the orientation of a structure, such as "vertical", "under", "above", "lateral" etc. are applied assuming that the structure is oriented in the manner shown in the figures.

DETAILED DESCRIPTION OF PARTICULAR EMBODIMENTS

Figure 1A:
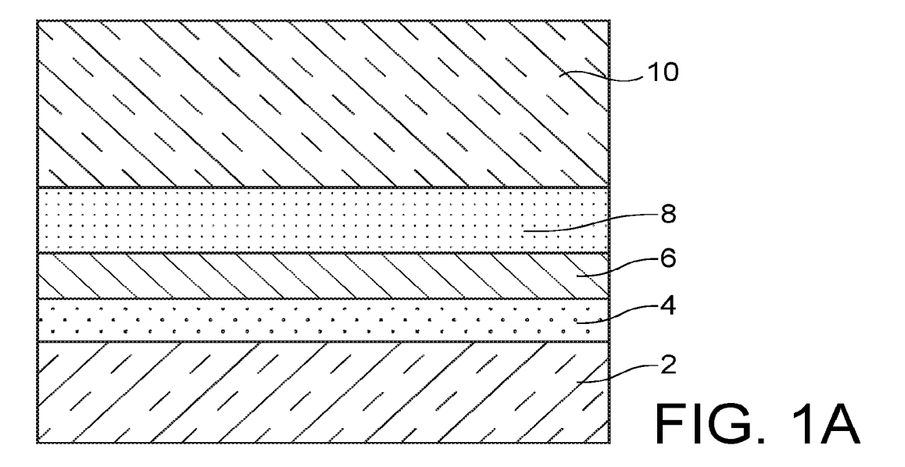

Reference will now be made to FIG. 1A which shows an example of a stack from which semimetal material based transistor structure with a channel and which has a vertical arrangement may be formed.

The stack in this example comprises a layer of substrate 2, for example made of silicon, on which an insulating layer 4 rests.

The layer of substrate 2 may be a surface layer of a substrate of semiconductor-on-insulator type, or a support layer in which one or more transistor elements, for example transistor channels (not show) may advantageously have already been formed.

The insulating layer 4 is for example made from silicon oxide or silicon nitride or silicon oxynitride. This insulating layer 4 may be provided with a thickness of between, for example, 10 nm and 100 nm and may be formed by thermal oxidation of the semiconductor layer 2 or by deposition, in particular of the Chemical Vapour Deposition (CVD) or Plasma Enhanced Chemical Vapour Deposition (PECVD) type.

On the insulating layer 4, a source or drain contact zone 6 is formed. This contact zone 6 is made from a layer of metallic material, selected in particular so as to be difficult to oxidise. The material is typically a noble metal, for example such as Pt, deposited on the insulating layer 4. The layer of metallic material has a thickness which may be between, for example, 5 and 50 nm, where this thickness is adapted as a function of the desired resistance to be conferred to the contact zone 6.

The contact zone 6 is here covered by a layer 8 which is preferably insulating and for example based on $SiO_2$ or on silicon nitride or silicon oxynitride.

The insulating layer 8 has a thickness which may be between for example 5 and 30 nm, typically of the order of 10 nm and may be formed by deposition, for example according to a CVD or PECVD technique.

On the insulating layer 8, a layer of gate material 10 is formed, for example a material such as Si or Ge or SiGe, where the gate material is typically deposited in amorphous form or as polycrystalline material. The gate material 10 is for example deposited by a CVD or PECVD technique or by an electron beam evaporation technique. The material 10 may be doped in situ, in other words during the deposition, or by implantation. A crystallisation annealing of the gate material may also be envisaged. Since the transistor is envisaged as having a vertical channel structure, the thickness of the deposited gate material 10 in this example corresponds to the length of the gate of the structure made. The thickness of gate material may be envisaged to be, for example, between 10 nm and 100 nm, for example of the order of 30 nm.

Figure 1B:
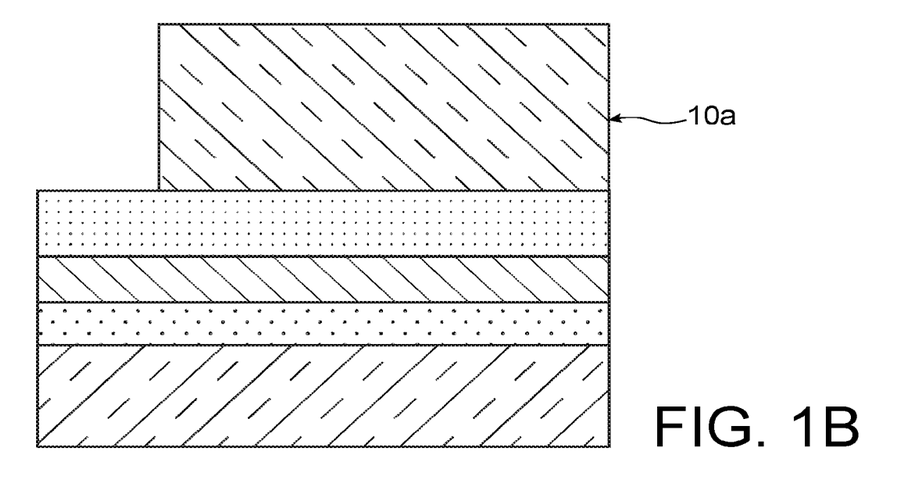
Figure 1C:
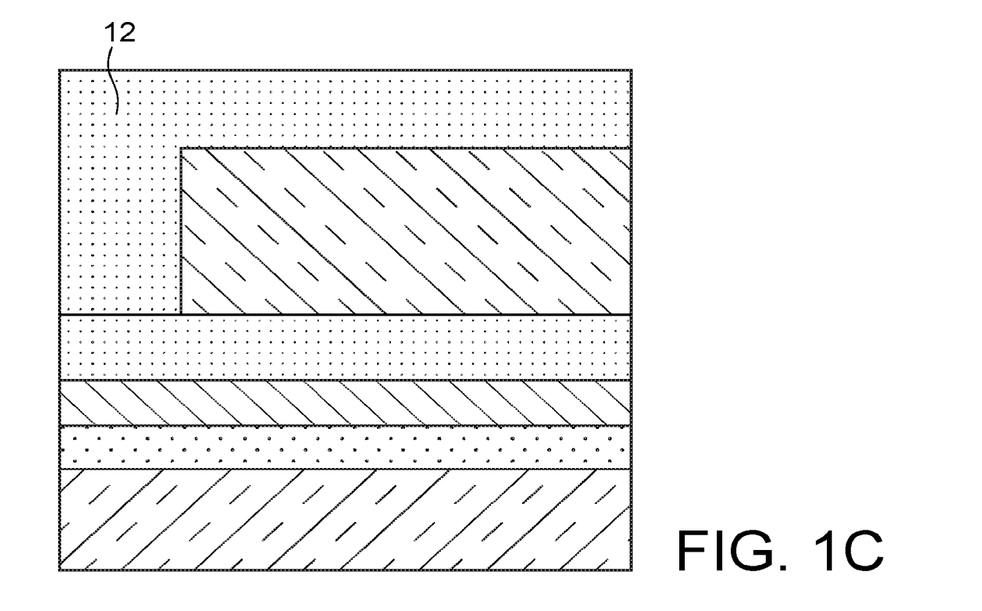

FIG. 1B shows a step for formation of a gate block 10a in the material 10, for example by photolithography and etching.

An insulating layer 12 is then formed, here covering the lateral flanks and the top of the gate block 10a. This insulating layer 12 is for example made from silicon oxide or silicon nitride or silicon oxynitride. The insulating layer 12 may be envisaged has having a thickness between for example 5 and 50 nm and may be formed by deposition, in particular a deposition of the CVD or PECVD type.

Then one or more holes are made which pass through the gate block 10a in order to define one or more locations for a channel structure.

Figure 1D:
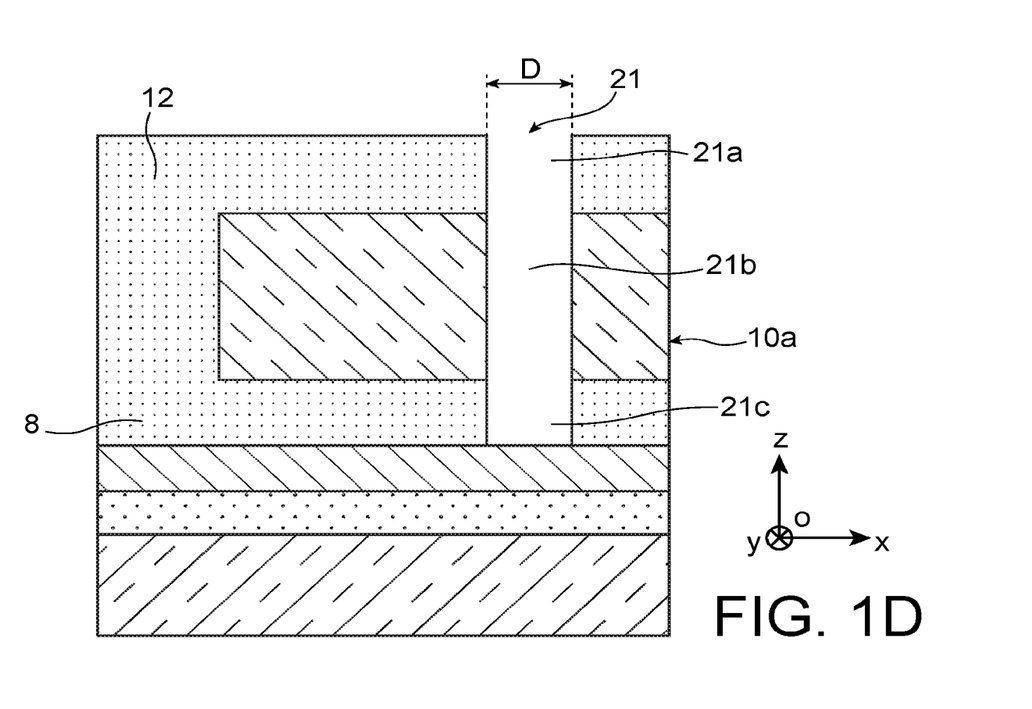

In the example shown in FIG. 1D, a hole 21 revealing the source or drain contact zone 6 is made through the thickness of the gate block 10a. The contact zone 6 is preferably not etched, so that the hole 21 is located at an upper face of the contact zone 6.

This hole 12 may be formed with a critical dimension also called the diameter D (dimension measured parallel to the plane [O; x; y] of a coordinate [O;x; y; z]) between, for example, 10 and 40 nm. The term "critical dimension" means the smallest dimension of a pattern measured in the plane (i.e. parallel to the plane [O;x;y]) other than its height or thickness (the height or thickness here being a dimension measured parallel to the axis z). The hole 21 may have a cross-section (in other words a section parallel to the principal plane of the substrate and therefore parallel to the plane [O;x;y]) of circular, or hexagonal, or rectangular or ellipsoidal form. To obtain such a hole 21 a hard mask may be formed which reproduces the hole pattern, where this hard mask may itself be structured using masking, for example made of a block co-polymer and an etching technique using an electron beam or by optical lithography which uses UV or EUV (extreme UV) radiation, or by any other pattern-transfer technique such as a nano-imprint type technique during which patterns are typically formed by applying an embossing mould.

Then enlargement of the portions 21a, 21c of the hole 21 located in the layers 12 and 8 located respectively on the gate block 10a and beneath the gate block 10a is carried out. A portion 21b of the hole passing through the gate block 10a may, for its part, be retained as it is or with a smaller cross-section S1 than that S2 of the portions 21a, 21b located respectively at the opening and at the base of the hole 21.

Figure 1E:
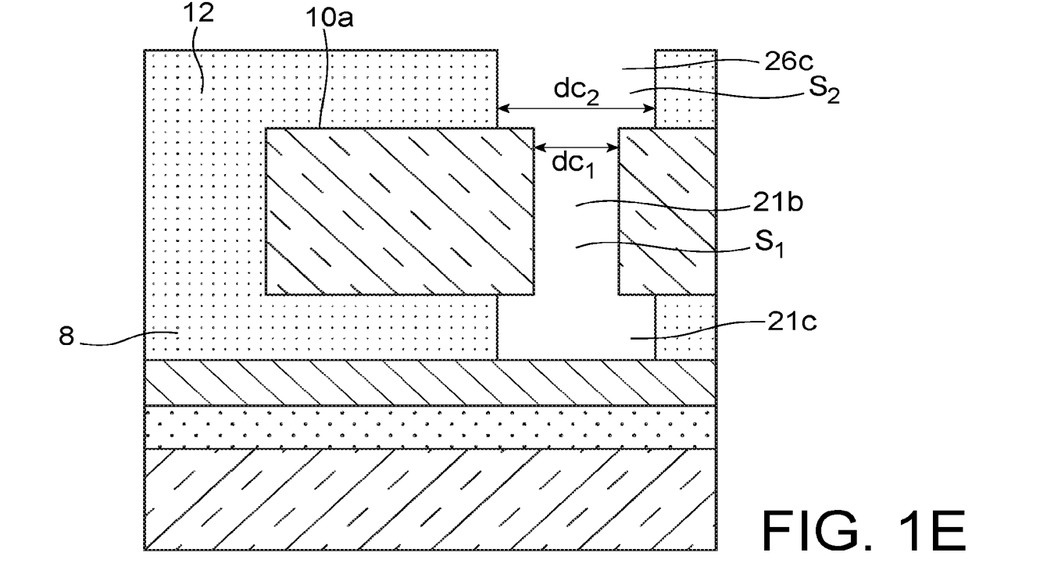

FIG. 1E illustrates an example of an arrangement of the hole 21 obtained once this enlargement step has been implemented.

The portions 21a, 21c have, after this enlargement step, a greater upper cross-section and therefore a critical dimension dc2 (also called the diameter dc2) which is greater than the critical dimension (or diameter) dc1 of the central portion 21b which extends through the gate block 10a.

One way of carrying out the enlargement of the portions 21a, 21c of the hole 21 is to carry out selective etching of the layers 12 and 8 respectively located on an upper face F1 of the gate block 10a and beneath a lower face F2 of the gate block 10a. The lower faces F1, F2 are here faces of the gate block that are parallel or substantially parallel to the substrate.

When the layers 12, 8 are made of $SiO_2$, such etching may be carried out using, for example, HF.

The stack may be protected during this etching by a mask (not shown) for example by the hard mask used to make the hole 21.

Figure 1F:
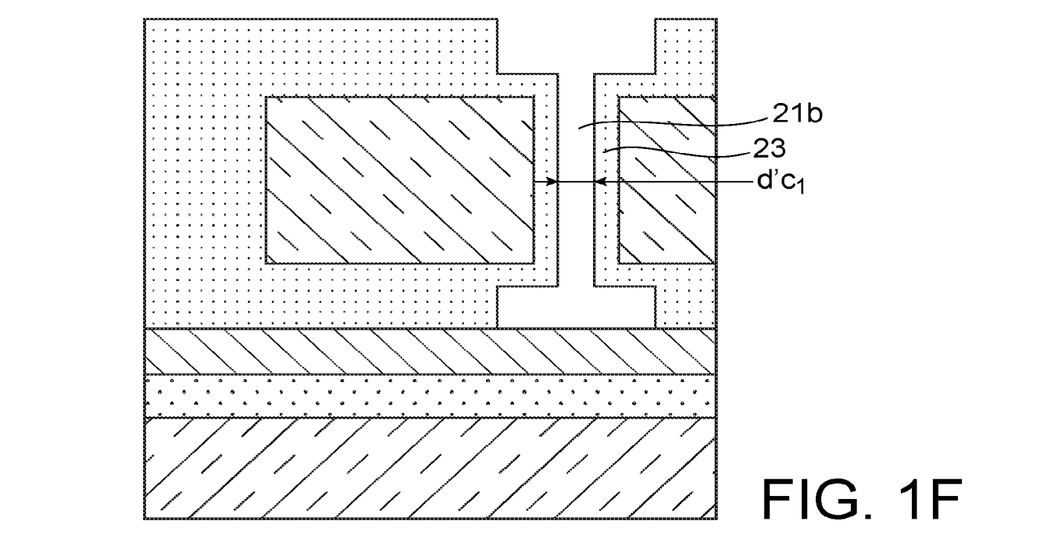

FIG. 1F shows a later step for formation of a gate dielectric layer 23, in particular at the gate block 10a zones which form the side walls of the portion 21b of the hole passing through the gate block 10a.

One way of making this gate dielectric is to perform oxidation of the gate block 10a, in particular when the latter is made of polysilicon or of polySiGe or of polyGe. The formation of the layer 23 of the gate dielectric leads to shrinkage of the central portion 21b of the hole 21 passing through the gate block 10a. The shrinkage may be such that a central portion 21b of the hole 21 has a critical dimension $d'c_1$ of the order of several nanometres and in particular less than 10 nm. For example, a central portion 21b of the order of 6 nm may be obtained.

Making the contact zone 6 of noble metal, for example Pt, advantageously avoids oxidation of this zone during the oxidation of the gate block 10a. Thus having to remove the gate dielectric from the contact zone 6 is avoided and in this manner a better quality contact can be produced.

Figure 1G:
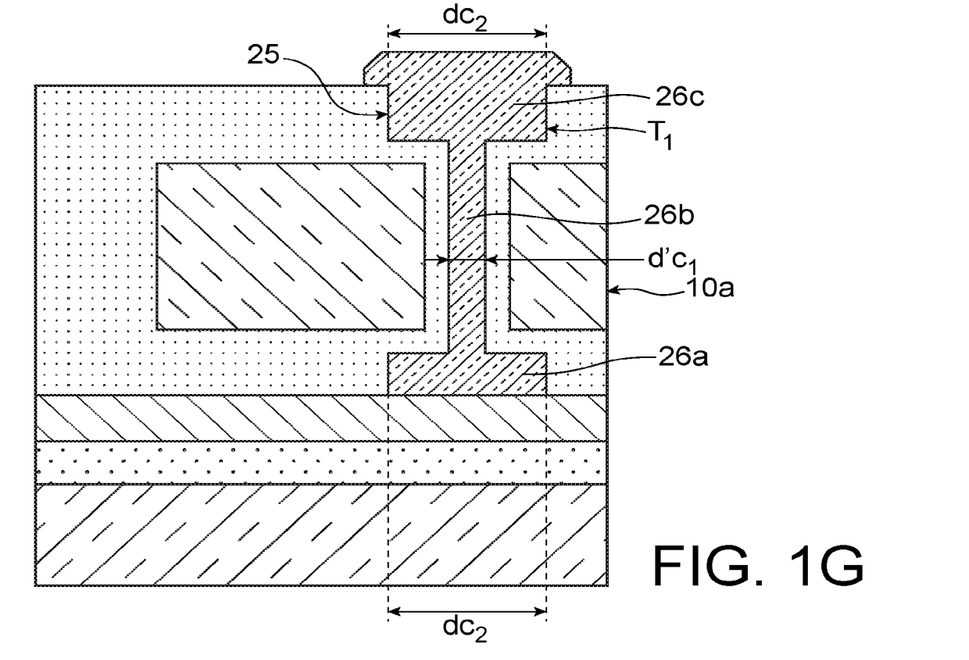

In FIG. 1G a step for filling the hole 21 with a semimetal based material 25 is shown. The deposited material is in particular bismuth or a bismuth-based alloy. An alloy based on bismuth and tin, or on bismuth and antimony or on bismuth and arsenic may, for example, be used. The material 25 may be doped, for example, with boron or with gallium or with tin or with tellurium. Advantageously, a non-doped semimetal is used.

Thus a channel structure 26b is formed in the central portion 21b of the hole which extends through the gate block 10 and the regions 26a, 26c which are capable of forming a source and a drain respectively in the enlarged portions 21a, 21c of the hole 21. The dimensions of the structure 26b, in particular its cross-section or its critical dimension $d'c_1$ are made smaller than a predetermined limit such that the structure 26b made of semimetal behaves as a semiconductor structure. This predetermined limit dref depends on the filling semimetal. For example, when the filling material 25 is bismuth a critical dimension is advantageously used which is less than 15 nm at ambient temperature. To obtain a semiconductor channel region, the dimension of the central portion 21b of the hole 21 and the thickness of the gate dielectric 23 used are therefore less than a predetermined value which depends on said above mentioned threshold dref. In order to establish such a threshold the resistance of the nanowire as a function of temperature may be evaluated. If the resistance increases with temperature, the material behaves like a (semi) metal. If the resistance decreases when the temperature increases, it acts like a semiconductor. The measurement is repeated on nanowires of different diameters. The document by Zhibo Zhang et al., "Electronic transport properties of single-crystal bismuth nanowire arrays", PHYSICAL REVIEW B VOLUME 61, NUMBER 7 15 Feb. 2000-I, p. 8450] for example describes such a method.

For BiSb, such a threshold is for example of the order of 65 nm, according to "Semimetal-semiconductor transition in $Bi_{1-x}Sb_x$ alloy nanowires and their thermoelectric properties", Yu-Ming Lin, O. Rabin, S. B. Cronin, Jackie Y. Ying, and M. S. Dresselhaus, Appl. Phys. Lett. 81, 2403 (2002); doi: 10.1063/1.1503873] and "Transport properties of alloy nanowires synthesized by pressure injection", Appl. Phys. Lett. 79, 677 (2001) de Yu-Ming Lin, S. B. Cronin, O. Rabin, Jackie Y. Ying, and M. S. Dresselhaus.

As for the dimensions of the regions 26a, 26c and in particular their critical cross-section or dimension dc2, these are made larger so that the regions 26a, 26c exhibit conductive behaviour which may approach that of a metal. The critical dimension dc2 is made such that dc1<dref<dc2.

Thus there are source and drain regions made of the same material as the channel region, but whose band structure is different.

In the structure shown in FIG. 1G, the first region 26a comprises a portion 261 which is in contact with the gate dielectric 23 and which extends facing the upper face F1 of said gate block. The second region 26b also comprises a portion 262 in contact with the gate dielectric 23 which extends facing the lower face F2 of said gate block.

Advantageously, an electrolytic deposition method also known as "electro-deposition" is used to carry out filling with semimetal. A bismuth salt-based solution, for example bismuth chloride, may in particular be used. Another filling method includes deposition by CVD or Molecular Beam Epitaxy (MBE). The semimetal 25, in particular Bismuth, is typically deposited in polycrystalline form.

Figure 1H:
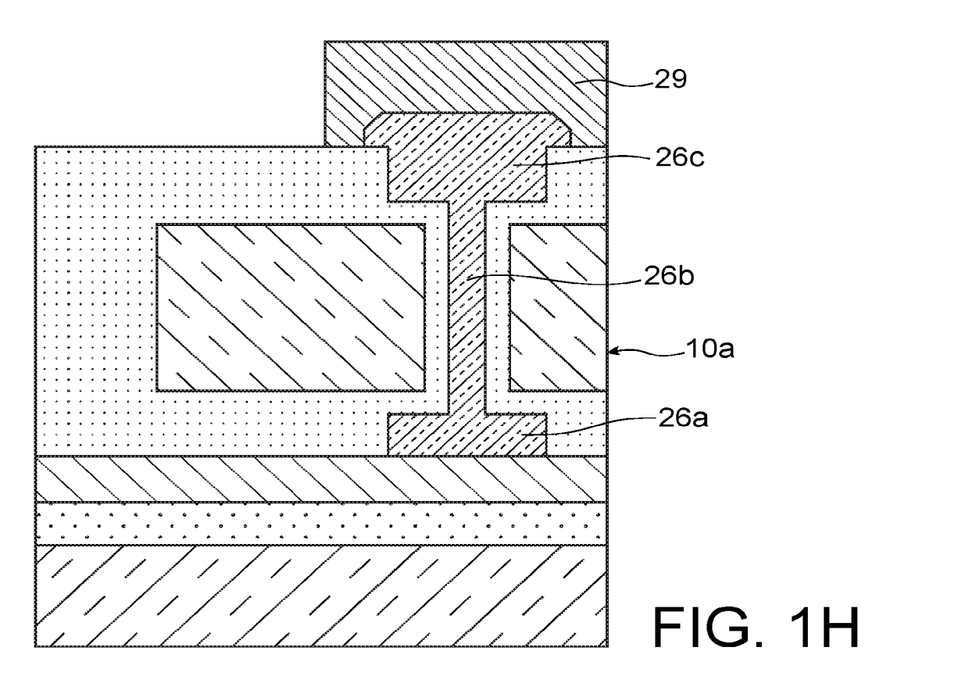

FIG. 1H shows a step for formation of a contact 29 on the structure 26 made of bismuth. This contact may be based on the same material as the contact zone 6, for example Pt, or on a different material, for example copper or gold. When the contact zone 6 is a source contact zone, the upper contact 29 made on the structure made of bismuth is then a drain contact.

One method for forming such a contact 29 uses a method of a type known as "lift-off" in which a mask is formed, for example of resin, which comprises an opening which reveals the structure 26 made of bismuth. The mask and a portion of the material used to form the contact which is found on this mask is then removed.

Alternatively, a full plate deposition, then photolithography and etching steps are performed in order to define the contact 29 which is positioned, in this example, on a drain region 26c made of bismuth.

Figure 1I:
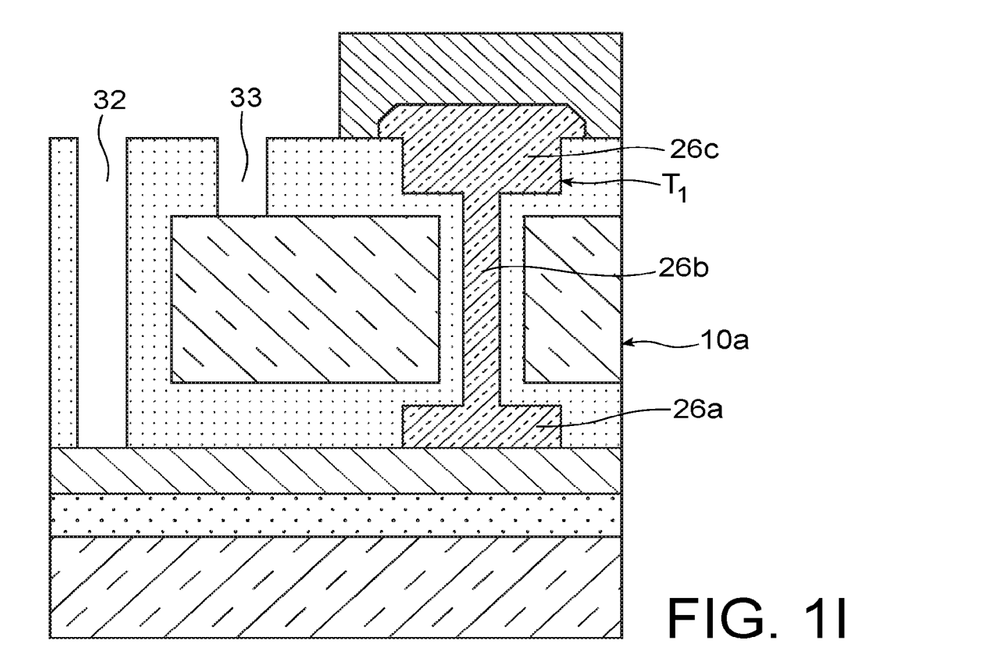
Figure 1J:
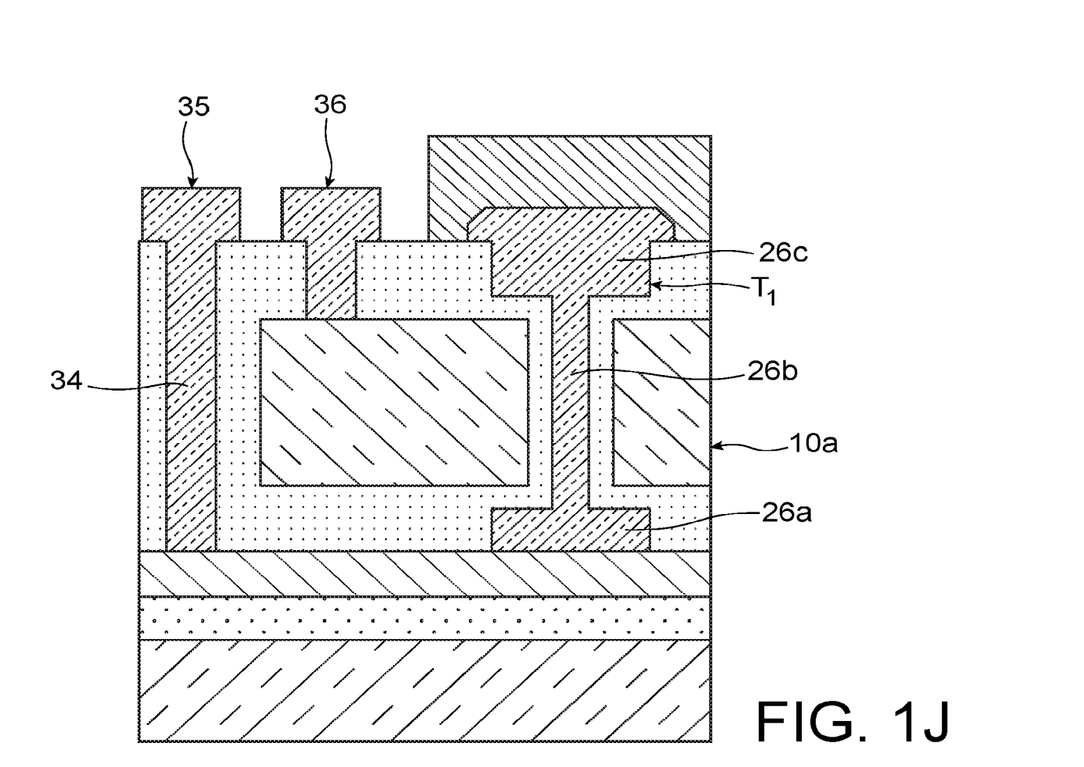

As shown in FIGS. 1I-1J, connection pads can also be formed to make contact points on various level of the stack, in particular in the contact zone 6 positioned beneath the transistor and on the transistor gate 10a.

To do this openings 32, 33 which reveal the contact zone 6 and the gate 10 respectively may be made. In the embodiment in FIG. 1I, an opening 32 thus passes through layers 12 and 8, whereas the other opening 33, passes through the layer 12. The openings 32, 34 are then filled with conductive material 34, for example tungsten, cobalt or aluminium. A barrier material can also be used such as titanium nitride (TiN) covered with copper.

Then structuring of the conductive material 34 may be carried out if it is desired to make connection pads 35, 36, to establish electrical contact, respectively, with the transistor source and to establish a distinct and independent electrical contact with the transistor gate. Such a step is, for example, shown in FIG. 1J.

Figure 1K:
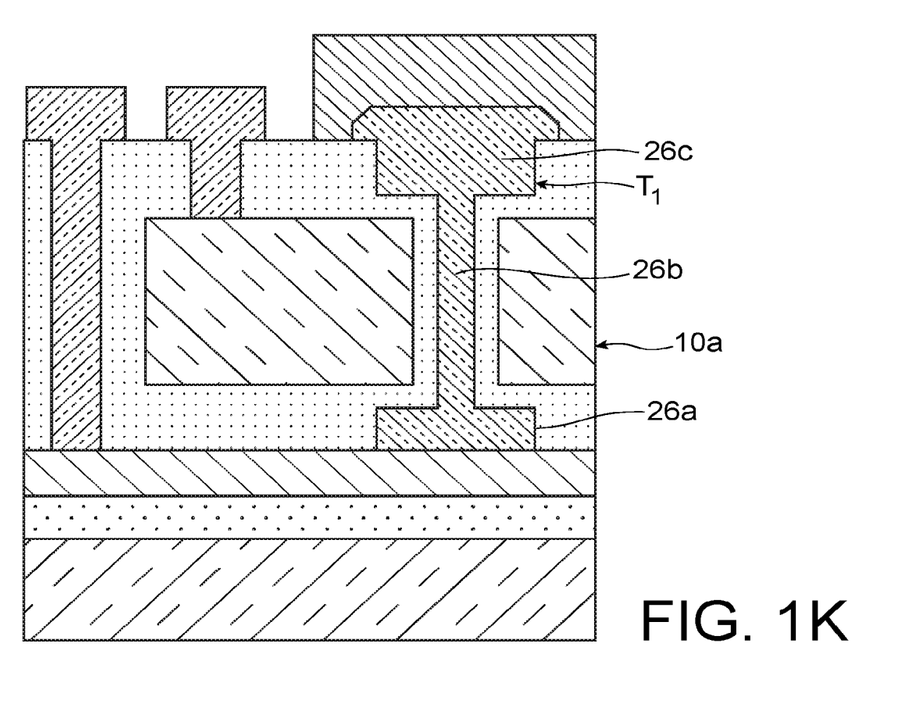

Then a recrystallisation step of the material 25 on which the transistor source, channel and drain regions are formed (FIG. 1K) may be carried out. This step is performed at a temperature which is greater than the fusion temperature of the material 25. In particular a temperature of the order of 271.4° C. or above is used depending on whether the material 25 is bismuth or a bismuth-based alloy. Bismuth has the advantage of melting at a low temperature, in particular less than 400° C., and of undergoing little or no expansion when it melts. It can therefore be crystallised without generating undesirable stresses or damaging subjacent layers in the event that the structure is formed on a semiconductor substrate containing structures such as transistors and metallic interconnection levels.

In the embodiment which has just been described, the contact zone 6 which extends beneath the gate 10a and the channel structure 26b of the transistor is a contact zone with the transistor source region 26c. Alternatively this contact zone 6 may be a drain contact zone, whilst the upper contact 29 positioned above the gate 10a is a source contact of the transistor.

In the embodiment example shown in FIGS. 1A-1K, the connection pads 35, 36 are made after the semimetal structure. Alternatively, these connection pads may be made before, since the step for recrystallisation annealing of this structure is carried out at a relatively low temperature, in general below 400-500° C.

In the embodiment example which has just been described, a channel structure in the form of a bar, also known as a "nanowire" with a constant or substantially constant cross-section is formed. Other forms of channel structure may be used.

Figure 2A:
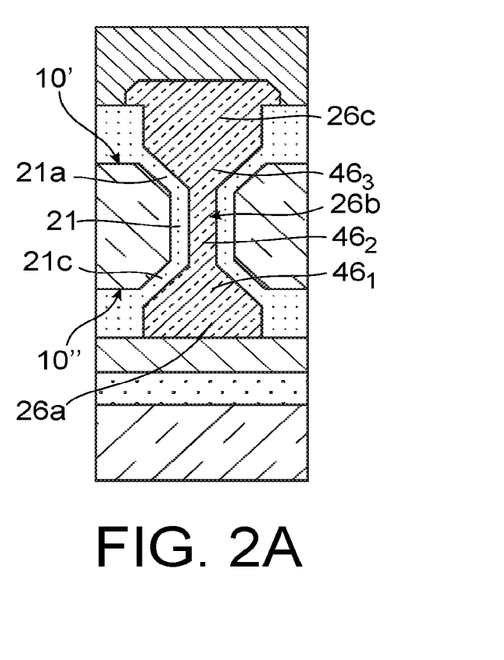

Another embodiment example shown in FIG. 2A envisages a bismuth-based transistor formed of a channel structure 26b, this time comprising a upper 46₃ and lower 46₁ ends whose forms are flared relative to a central region 46₂. The regions 46₁ and 46₃ are in contact respectively with the source region 26a and drain region 26c of the transistor made of semimetal.

Such a form can be obtained using the etching method used to make the hole 21 which passes through the gate block 10a. The hole 21 has, in this example, enlarged portions 21a, 21c, respectively next to an upper face 10' and a lower face 10" of the gate block 10a. Such an arrangement allows a more gentle transition in form to be used between, on one hand, the source or drain region and on the other hand the channel. This may limit electron reflection effects and therefore prevent a reduction in the current.

Figure 2B:
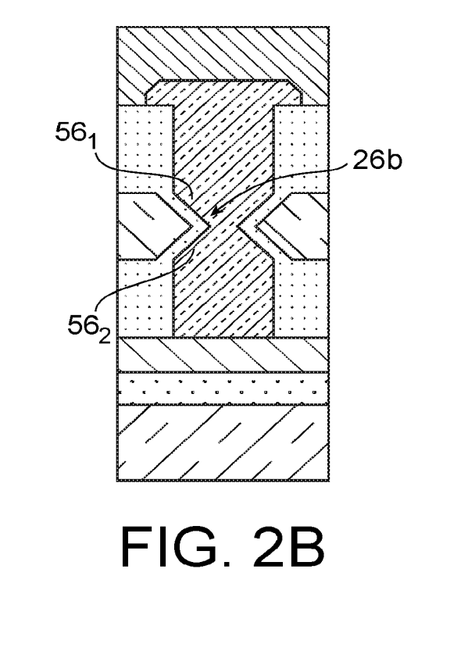

In the example shown in FIG. 2B, a transistor made of bismuth is this time equipped with a channel structure 26b formed of regions 56₁, and lower regions 56₂ each having a cross-section that gradually decreases as the centre is approached. The channel 26b is thus formed of regions 56₁ and 56₂ with a flared form, arranged head-to-tail in relation to each other.

Figure 2C:
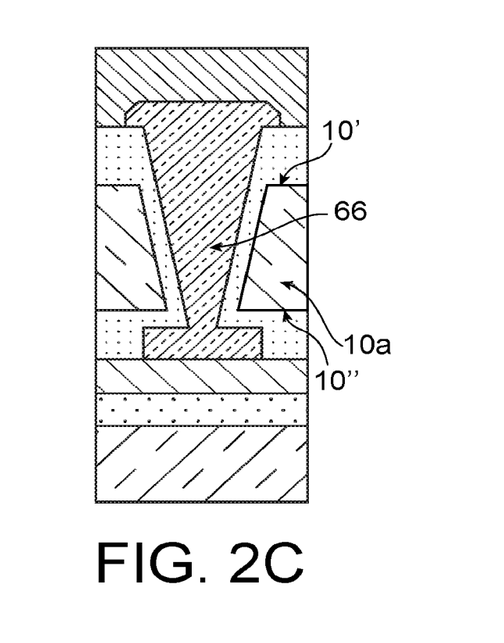

Another example shown in FIG. 2C envisages a transistor channel structure 26b made of bismuth, this time formed of a portion 66 with a cross-section which decreases between a zone located at an upper face 10' of the gate 10a and another zone located at a lower face 10" of the gate 10a. The portion 66 may in particular be tapered in form.

To achieve such a form the creation of a gate block may be envisaged which exhibits a dopant gradient between its lower face 10" and its upper face 10', and then etching through this block. The gradient may in particular be made such that the block 10a is more highly doped at its lower face 10" than at its upper face 10'. For example, when the gate block 10a is made of polysilicon, then in order to obtain a hole and a structure filling this hole with such a shape, a dopant gradient of phosphorous may be used and then etching carried out using, for example, a chemical attack agent which is sensitive to the concentration of doping impurities.

Figure 2D:
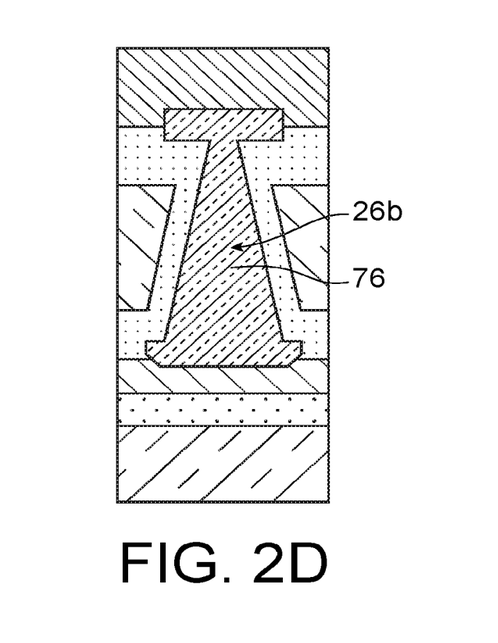

As with the example described previously, the transistor shown in FIG. 2D comprises a channel structure 26b with a flared form but which differs from that described above in that it is formed of a portion 76 whose cross-section this time decreases as one moves away from a lower face 10" of the gate block 10a and as one approaches an upper face 10' of the gate block 10.

A transistor made of semimetal and with a vertical channel structure may be made in a device comprising several stacked transistors of the same type.

Figure 3A:
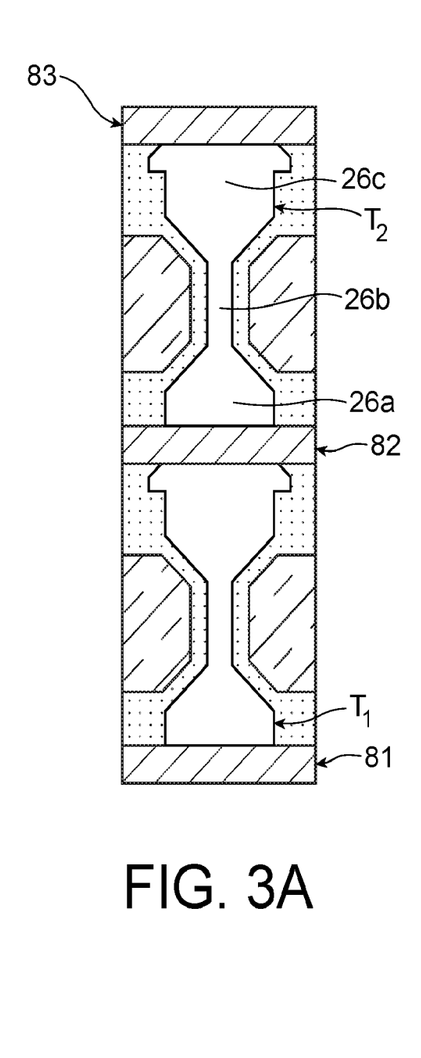
Figure 3B:
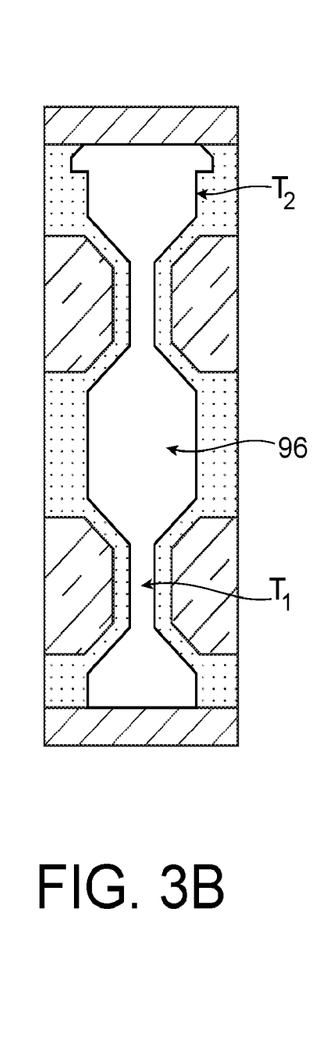

In the embodiment example shown in FIGS. 3A, 3B, two transistors Ti, T2 which have a structure of the type described previously are arranged one above the other and each comprise source and drain regions made of bismuth which have a cross-section greater than that of the channel structure 26b, itself made of bismuth.

Such a device may be envisaged for creating vertical connection elements or vias which form controllable switches between, respectively, conductive lines 81, 82 and between conductive lines 82, 83 of different levels. The conductive lines 81, 82, 83 arranged at different interconnection levels of the device are made, for example, of platinum.

In the particular embodiment shown in FIG. 3A, each transistor level is arranged between two conductive lines.

In another embodiment example shown in FIG. 3B, transistors T1, T2 this time share a common electrode 96. Thus several superimposed bismuth electrodes are envisaged, in particular two stacked transistors, in order to allow a connection to be made between two conductive lines 81, 83.

Figure 3C:
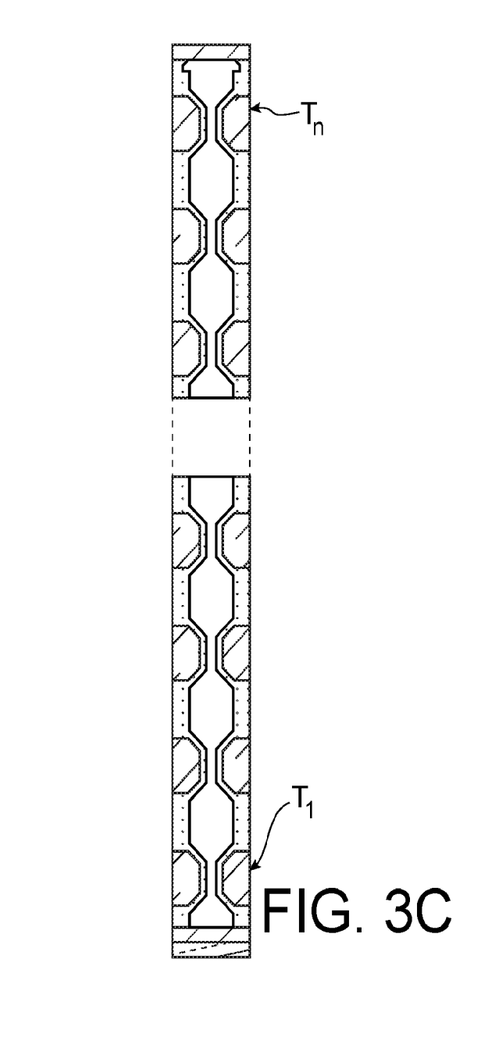

A device with a number of transistors T1, . . . , Tn greater than 2 may be envisaged. Thus in the example shown in FIG. 3C, n bismuth-based transistors T1, . . . , Tn (where n is an integer such that n>1) are stacked.

Figure 4A:
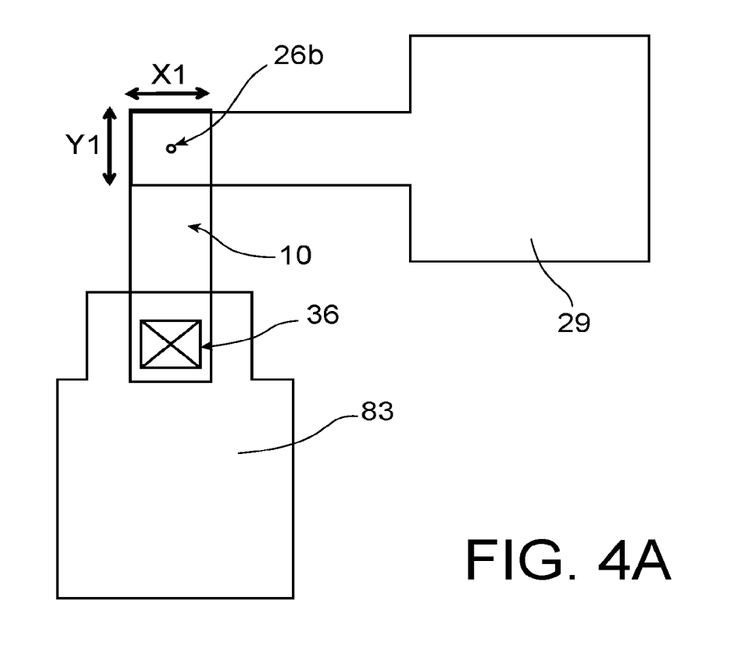

An example of a layout of drain and gate contacts 29, 83 of a bismuth-based transistor of the type as described previously is given in FIG. 4A. As in the examples given previously, the transistor is equipped with a channel structure 26b in the form of a bar or of a vertical nanowire which passes through a gate block 10a.

Figure 4B:
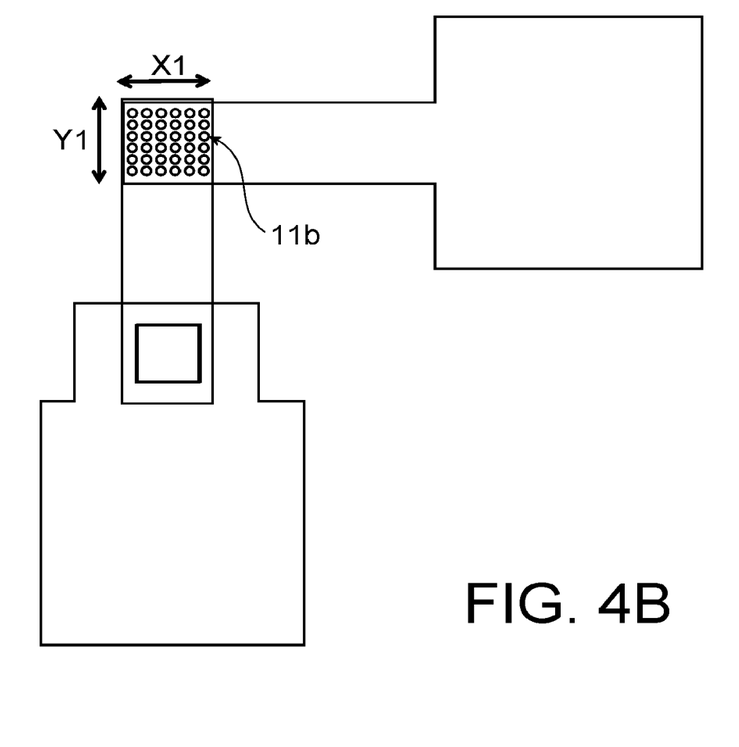

Alternatively, a channel structure 26b may be provided in the form of a plurality of parallel nanowires 11b passing through the gate block 10a. Thus, in the particular embodiment example shown in FIG. 4B, 36 vertical nanowires or bars 11b are distributed in a gate block 10a, of rectangular

The invention claimed is:

1. A vertical channel transistor comprising:
a gate block, and
a structure made of a given bismuth-based material which passes through the gate block,
wherein the structure comprises a channel region extending through the gate block, from a lower face to an upper face of the gate block and a first region and a second region on either side of the channel region and of the gate block,
the first region and the second region respectively forming a bismuth-based source and a bismuth-based drain, each of said first and second regions comprising a portion having a cross-section which is greater than a cross-section of the channel region, with the portion being in contact with a gate dielectric zone that extends against and is in contact with the upper face and the lower face of the gate block, the portion extending opposite the upper face or said lower face of said gate block, and
wherein the transistor further comprises:
a source contact zone and located against the bismuth-based source region, and
a drain contact zone located against the bismuth-based source region.

2. The transistor according to claim 1, wherein the channel region comprises portions which pass through the gate block which are of flared form which are arranged head to tail.

3. The transistor according to claim 1, wherein the channel region comprises a portion of flared form between a first face and a second face of the gate block.

4. The transistor according to claim 1, wherein the channel region is formed from a plurality of bismuth-based nanowires.

5. A device comprising:
at least one first transistor according to claim 1, and
at least one second transistor according to claim 1, wherein the first transistor and the second transistor are stacked.

6. The device according to claim 5, wherein the first transistor and the second transistor have a common electrode.

7. The device according to claim 6, wherein the first transistor is positioned between the conductive lines of a first pair of conductive lines, and the second transistor being positioned between the conductive lines of second pair of conductive lines.

8. A vertical channel transistor, comprising:
a gate block having upper and lower faces,
a channel formed through the gate block in a first direction from said upper face to said lower face,
a dielectric layer formed on sides of the channel in the gate block, and
a structure comprising the following elements, each formed of bismuth-based material:
a channel region formed in the channel in contact with the dielectric layer and having a first cross section in a second direction crossing the first direction,
a source region connected to the channel, formed on one of the upper and lower faces, and having a second cross section in the second direction greater than the first cross section, and
a drain region connected to the channel, formed on the other of the upper and lower faces, and having a third cross section in the second direction greater than the first cross section.

9. The transistor according to claim 8, comprising:
a source contact connect to the source region, and
a drain contact connected to the drain region.

10. The transistor according to claim 8, wherein the channel region comprises at least one flared portion located between the upper and lower faces of the gate block.

11. The transistor according to claim 8, wherein the channel region comprises:
a first flared portion located between the upper and lower faces of the gate block and in contact with the source region, and
a second flared portion located between the upper and lower faces of the gate block and in contact with the drain region,
each of said first and second flared portions having an increasing cross section in the second direction moving toward the source and drain regions, respectively.

12. The transistor according to claim 8, wherein the channel region has one of:
an increasing cross section in the first direction, and
a decreasing cross section in the first direction.

13. The transistor according to claim 8, wherein:
the gate block comprises a plurality of channel regions, and
the structure comprises a plurality of channel regions each connected to the source and drain regions.

14. The transistor according to claim 8, comprising:
a first insulating material disposed on the upper face of the gate block,
a second insulating material disposed on the lower face of the gate block,
the source region being disposed in one of the first and second insulating materials overlapping with one of the upper and lower faces of the gate block, and
the drain region being disposed in the other of the first and second insulating materials overlapping with the other of the upper and lower faces of the gate block.

15. A device comprising:
at least one first transistor according to claim 8, and
at least one second transistor according to claim 8, where the first transistor and the second transistor are stacked in the first direction.

* * * * *